(12) United States Patent
Or

(10) Patent No.: US 8,833,418 B2
(45) Date of Patent: Sep. 16, 2014

(54) METHOD AND SYSTEM FOR BONDING ELECTRICAL DEVICES USING AN ELECTRICALLY CONDUCTIVE ADHESIVE

(75) Inventor: Derek Siu Wing Or, Hong Kong (HK)

(73) Assignee: The Hong Kong Polytechnic University, Hong Kong (HK)

( * ) Notice: Subject to any disclaimer, the term of this patent is extended or adjusted under 35 U.S.C. 154(b) by 326 days.

(21) Appl. No.: 13/340,168

(22) Filed: Dec. 29, 2011

(65) Prior Publication Data

US 2012/0097335 A1 Apr. 26, 2012

Related U.S. Application Data

(62) Division of application No. 12/546,207, filed on Aug. 24, 2009, now Pat. No. 8,129,220.

(51) Int. Cl.
*B32B 37/06* (2006.01)
*H01L 23/00* (2006.01)
*H01L 25/065* (2006.01)
*H01L 25/00* (2006.01)

(52) U.S. Cl.
CPC ....... *H01L 24/75* (2013.01); *H01L 2224/83101* (2013.01); *H01L 2924/01006* (2013.01); *H01L 24/83* (2013.01); *H01L 2924/0665* (2013.01); *H01L 2225/06565* (2013.01); *H01L 25/0657* (2013.01); *H01L 2924/01027* (2013.01); *H01L 2224/2919* (2013.01); *H01L 2224/32221* (2013.01); *H01L 2924/01032* (2013.01); *H01L 2924/01087* (2013.01); *H01L 2924/01005* (2013.01); *H01L 25/0652* (2013.01); *H01L 2924/01033* (2013.01); *H01L 2924/01019* (2013.01); *H01L 2224/8388* (2013.01); *H01L 2924/0781* (2013.01); *H01L 2224/83205* (2013.01); *H01L 2224/32145* (2013.01); *H01L 24/32* (2013.01); *H01L 24/29* (2013.01); *H01L 25/50* (2013.01); *H01L 25/0655* (2013.01); *H01L 2924/01074* (2013.01)
USPC ........................................ 156/378; 156/379.7

(58) Field of Classification Search
USPC ................. 156/349, 379.7; 432/225
See application file for complete search history.

(56) References Cited

U.S. PATENT DOCUMENTS 3,938,722 A 2/1976 Kelly et al.
4,040,885 A 8/1977 Hight et al.
(Continued)

FOREIGN PATENT DOCUMENTS

WO WO8804738 6/1988
WO WO9723340 7/1997
(Continued)

*Primary Examiner* — Chandra Chaudhari
(74) *Attorney, Agent, or Firm* — Muncy, Geissler, Olds & Lowe, P.C.

(57) ABSTRACT

A system for bonding electrical devices using an electrically conductive adhesive to adhere the electrical devices together, the system including: an ultrasonic transducer to generate an ultrasonic vibration; and an ultrasonic to thermal energy apparatus operatively attached to and covering an operational end of the ultrasonic transducer, the ultrasonic to thermal energy apparatus damping the ultrasonic vibration to minimize ultrasonic vibration transmitted to a first electrical device and causing the conversion of the ultrasonic vibration to a heating pulse which is conducted through the first electrical device to the adhesive. Whereby the adhesive is softened by the heating pulse to bond the electrical devices together.

11 Claims, 12 Drawing Sheets

(56) References Cited

U.S. PATENT DOCUMENTS

| | | | |
|---|---|---|---|
| 4,193,833 | A | 3/1980 | Young |
| 4,239,144 | A | 12/1980 | Elles et al. |
| 4,527,727 | A | 7/1985 | Renshaw |
| 4,529,115 | A | 7/1985 | Renshaw et al. |
| 4,572,753 | A | 2/1986 | Bach |
| 4,603,803 | A | 8/1986 | Chan et al. |
| 4,730,764 | A | 3/1988 | Hawkins et al. |
| 4,789,093 | A | 12/1988 | Bansemir |
| 4,792,079 | A | 12/1988 | Bansemir |
| 4,893,742 | A | 1/1990 | Bullock |
| 4,976,392 | A | 12/1990 | Smith et al. |
| 5,011,062 | A | 4/1991 | Nakanishi et al. |
| 5,029,746 | A | 7/1991 | Altpeter et al. |
| 5,156,318 | A | 10/1992 | Suzuki et al. |
| 5,190,206 | A | 3/1993 | Miller et al. |
| 5,198,056 | A | 3/1993 | Stockli et al. |
| 5,427,301 | A | 6/1995 | Pham et al. |
| 5,452,838 | A | 9/1995 | Farassat |
| 5,591,298 | A | 1/1997 | Goodman et al. |
| 5,603,444 | A | 2/1997 | Sato |
| 5,655,700 | A | 8/1997 | Pham et al. |
| 5,667,130 | A | 9/1997 | Morita et al. |
| 5,669,545 | A | 9/1997 | Pham et al. |
| 5,782,575 | A | 7/1998 | Vincent et al. |
| 5,785,786 | A | 7/1998 | Suzuki et al. |
| 5,871,136 | A | 2/1999 | Miller |
| 5,884,835 | A | 3/1999 | Kajiwara et al. |
| 6,078,125 | A | 6/2000 | Roberts |
| 6,089,438 | A | 7/2000 | Suzuki et al. |
| 6,168,063 | B1 | 1/2001 | Sato et al. |
| 6,176,953 | B1 | 1/2001 | Landreth et al. |
| 6,202,915 | B1 | 3/2001 | Sato |
| 6,213,377 | B1 | 4/2001 | Schwerdtle et al. |
| 6,238,503 | B1 | 5/2001 | Kakehi |
| 6,247,628 | B1 | 6/2001 | Sato et al. |
| 6,296,171 | B1 | 10/2001 | Hembree et al. |
| 6,382,494 | B1 | 5/2002 | Miller |
| 6,399,419 | B1 | 6/2002 | Shibata et al. |
| 6,437,450 | B1 | 8/2002 | Baba et al. |
| 6,523,732 | B1 | 2/2003 | Popoola et al. |
| 6,574,944 | B2 | 6/2003 | Capodieci |
| 6,576,499 | B2 | 6/2003 | Funaya et al. |
| 6,588,646 | B2 | 7/2003 | Loprire |
| 6,602,733 | B2 | 8/2003 | Iwahashi et al. |
| 6,609,648 | B2 | 8/2003 | Kondo |
| 6,669,074 | B2 | 12/2003 | Sato |
| 6,691,909 | B2 | 2/2004 | Skogsmo et al. |
| 6,824,630 | B2 | 11/2004 | Oishi et al. |
| 6,838,316 | B2 | 1/2005 | Iizuka et al. |
| 7,124,504 | B2 | 10/2006 | Steiner et al. |
| 7,134,588 | B2 | 11/2006 | Kobae et al. |
| 7,291,910 | B2 | 11/2007 | Khandros et al. |
| 7,370,786 | B2 | 5/2008 | Kurita et al. |
| 7,392,923 | B2 | 7/2008 | Stroh et al. |
| 7,629,687 | B2 | 12/2009 | Kozaka et al. |
| 7,745,977 | B2 * | 6/2010 | Aoki et al. ............... 310/334 |
| 7,828,030 | B2 * | 11/2010 | Kobayashi et al. ........ 156/379.8 |
| 2002/0048848 | A1 | 4/2002 | Ikegami |
| 2002/0070459 | A1 | 6/2002 | Iwasaki et al. |

FOREIGN PATENT DOCUMENTS

| | | |
|---|---|---|
| WO | WO9828123 | 7/1998 |
| WO | WO9918563 | 4/1999 |
| WO | WO9946110 | 9/1999 |
| WO | WO0009314 | 2/2000 |
| WO | WO0015381 | 3/2000 |
| WO | WO0067944 | 11/2000 |
| WO | WO0154851 | 8/2001 |
| WO | WO02073686 | 9/2002 |
| WO | WO03051569 | 6/2003 |
| WO | WO03103039 | 12/2003 |
| WO | WO03105214 | 12/2003 |
| WO | WO2004016036 | 2/2004 |
| WO | WO2004062842 | 7/2004 |
| WO | WO2004073927 | 9/2004 |
| WO | WO2004089612 | 10/2004 |
| WO | WO2005000528 | 1/2005 |
| WO | WO2005005090 | 1/2005 |
| WO | WO2005065940 | 7/2005 |
| WO | WO2005067345 | 7/2005 |
| WO | WO2005068188 | 7/2005 |
| WO | WO2005117096 | 12/2005 |
| WO | WO2005121018 | 12/2005 |
| WO | WO2006045218 | 5/2006 |
| WO | WO2006081106 | 8/2006 |
| WO | WO2006111097 | 10/2006 |
| WO | WO2006112183 | 10/2006 |
| WO | WO2006134953 | 12/2006 |
| WO | WO2006135773 | 12/2006 |
| WO | WO2007061216 | 5/2007 |
| WO | WO2007072668 | 6/2007 |
| WO | WO2007076696 | 7/2007 |
| WO | WO2007112393 | 10/2007 |
| WO | WO2007134317 | 11/2007 |
| WO | WO2008001283 | 1/2008 |
| WO | WO2008008004 | 1/2008 |
| WO | WO2008018160 | 2/2008 |
| WO | WO2008020327 | 2/2008 |
| WO | WO2008028219 | 3/2008 |
| WO | WO2008046396 | 4/2008 |
| WO | WO2008046397 | 4/2008 |
| WO | WO2008066190 | 6/2008 |
| WO | WO2008094368 | 8/2008 |
| WO | WO2008126143 | 10/2008 |
| WO | WO2008126211 | 10/2008 |
| WO | WO2008126212 | 10/2008 |
| WO | WO2008151964 | 12/2008 |

* cited by examiner

METHOD AND SYSTEM FOR BONDING ELECTRICAL DEVICES USING AN ELECTRICALLY CONDUCTIVE ADHESIVE

This nonprovisional application is a divisional of U.S. application Ser. No. 12/546,207, which was filed on Aug. 24, 2009, and which is herein incorporated by reference.

BACKGROUND OF THE INVENTION

1. Field of the Invention

The invention concerns a method and system for bonding electrical devices using an electrically conductive adhesive.

2. Description of the Background Art

Traditionally, a wet conductive adhesive paste has been used to adhere a semiconductor die or chip to a substrate in die bonding. An external heating and pressurising means, which is referred to as a thermocompression means, is used to cure and press the adhesive paste underneath the die against the substrate so as to bond the die and the substrate together. In recent years, the continual reduction in thickness of dies from 500 to 25 μm has made a great impact on semiconductor die packages and their resulting electronic products as these thin dies not only enable ultrathin applications (e.g., smart cards, biological passports, etc.) but also promote ultrahigh-density applications (e.g., memories, CPUs, etc.). Problems of using a traditional adhesive paste in bonding a die of such thinness have been adhesive overflow and adhesive spread-out which cause an unavoidable short-circuit failure.

Dry conductive adhesive films or tapes such as Die Attach Film (DAF) or Thermoplastic Adhesive Tape (TAT) were developed to replace the traditional wet conductive adhesive pastes, especially in bonding thin dies of thicknesses less than 75 μm. DAF is usually laminated on the backside of the wafer before dicing the wafer into individual dies, while TAT is usually attached to the backside of individual dies after the wafer dicing process. A die laminated with DAF or TAT can be directly bonded to a substrate using heat and pressure which is referred to as thermocompression bonding and is also regarded as the state-of-the-art bonding method. Problems with this method have been a high bonding temperature of 100 to 180° C., a long bonding time of at least 3 seconds, a single die bonding per bonding cycle and a continual heating of fresh and post-bonded dies, adhesives and substrates throughout the bonding process. Yet void formation along the die-adhesive-substrate interfaces, a constrained bonding process window, a low throughput and the inability to use less expensive substrates such as synthetic resin bonded papers (SRBP, FR-1 and FR-2) which have lower operational temperatures than the bonding temperature of DAF or TAT have often occurred. The high temperature and lengthy heat exposure affects the reliability of the die package and bonding equipment.

WO 2007/061216 discloses a method for bonding electrical devices using flip chip ultrasonic vibration. As depicted in FIG. 2 of WO 2007/061216, the active (circuitry) surface of the die flips over or faces away from the ultrasonic transducer and connects to the substrate through the adhesive, while the inactive (ground) surface of the die makes contact with the transducer to ensure the active surface is not damaged by surface to surface friction from the transducer. To further mitigate the risk of damaging a die, the operational end of the transducer may be covered with a relatively hard, low damping, low friction and slippery Teflon cap. Heat is generated inside the adhesive itself as a by-product of the ultrasonic vibration. In other words, the ultrasonic vibration is applied to the inactive surface of the die which vibrates relative to the active surface of the die, the adhesive and the substrate, and this friction generates heat. WO 2007/061216 also discloses applying an additional amount of heat to all or some of the upper and lower bonding portions using an external heat source. WO 2007/061216 further discloses using a die collet for fixing the die at its inactive surface. The die collet also functions as a size adapter for the transducer when there is a size difference between the operational end of the transducer and the die. For example, there are die collets made from extra hard tungsten carbide with low internal damping.

The primary purpose of WO 2007/061216 is to ensure that ultrasonic vibration reaches the adhesive via the die. Therefore, the die must conduct the ultrasonic vibration to the adhesive. The by-product of the ultrasonic vibration reaching the adhesive is that heat is generated from the friction to the adhesive. However, the risk is that the die, especially thin dies, may be broken or powdering caused by the ultrasonic vibration transmitted through the die.

There is a desire for a bonding method and system to address at least some of the abovementioned problems.

SUMMARY OF THE INVENTION

In a first preferred aspect, there is provided a method for bonding electrical devices using an electrically conductive adhesive to adhere the electrical devices together. The method includes generating ultrasonic vibration by an ultrasonic transducer. The method also includes damping the ultrasonic vibration to minimise ultrasonic vibration transmitted to a first electrical device and causing the conversion of the ultrasonic vibration to a heating pulse which is conducted through the first electrical device to the adhesive. The method also includes softening the adhesive using the heating pulse to bond the electrical devices together.

The method may further comprise concentrating the heating pulse to a surface area that is larger than or equal to an active surface area of the first electrical device.

The method may further comprise applying a static pressure and an electrical energy to the ultrasonic transducer.

The electrically conductive adhesive may be a dry conductive adhesive film or tape such as Die Attach Film (DAF) or Thermoplastic Adhesive Tape (TAT).

The first electrical device may be a die and the second electrical device may be a substrate.

The active surface area of the first electrical device may face the ultrasonic transducer.

A plurality of first electrical devices having an electrically conductive adhesive between each of the first electrical devices may be provided, and the conversion of the ultrasonic vibration to a heating pulse may be conducted through the first electrical devices to each adhesive causing the adhesive to soften and bond the electrical devices together to form a stacked die package.

In a second aspect, there is provided an apparatus for converting ultrasonic to thermal energy. The apparatus includes a bottom surface to cover the operational end of an ultrasonic transducer and contact an active surface of a first electrical device. The apparatus also includes a raised peripheral edge extending from the bottom surface for resiliently attaching the apparatus to the operational end of the ultrasonic transducer. The apparatus is made from a material that is viscoelastic and deformable and damps the ultrasonic vibration generated by the ultrasonic transducer and causing the conversion of the ultrasonic vibration to a heating pulse.

The apparatus may further comprise a protrusion outwardly projecting from the bottom surface of the apparatus to concentrate the heating pulse.

The major surface area of the protrusion may be larger than or equal to the active surface area of the first electrical device.

The major surface area of the protrusion may be larger than or equal to 60% of the bottom surface of the apparatus.

The height of the protrusion from the bottom surface may be 1 mm.

The apparatus may further comprise a plurality of protrusions to enable a plurality of dies to be bonded to at least one substrate at the same time.

The protrusion may have a concave shape for holding a die when a horizontal or transverse operation of the transducer is used.

The material may be a silicone rubber compound.

In a third aspect, there is provided a system for bonding electrical devices using an electrically conductive adhesive to adhere the electrical devices together. The system includes an ultrasonic transducer to generate an ultrasonic vibration. The system also includes an ultrasonic to thermal energy apparatus operatively attached to and covering the operational end of the ultrasonic transducer, the apparatus damping the ultrasonic vibration to minimise ultrasonic vibration transmitted to a first electrical device and causing the conversion of the ultrasonic vibration to a heating pulse which is conducted through the first electrical device to the adhesive. The adhesive is softened by the heating pulse to bond the electrical devices together.

The system may further comprise a die adapter attached to the ultrasonic transducer and disposed between the apparatus and the ultrasonic transducer, the die adapter providing a shape and size adaption for the ultrasonic transducer to accommodate a first electrical device of any shape and size.

The system may further comprise mechatronic equipment controlled by a central control unit, the mechatronic equipment including:

a. a three-axis linear motion system to provide precise movement of the worktable in the x and y directions and of the ultrasonic transducer and the apparatus in the z direction in the mechatronic equipment;

b. a thermal management system to control the temperature of the worktable;

c. a pressure control system to apply a static pressure to the ultrasonic transducer and the apparatus to press the adhesive underneath the first electrical device against a second electrical device, d. a vision system to instruct the three-axis linear motion system where to move the first electrical device based on an image captured of the first electrical device and the worktable and to perform in-situ preproduction and postproduction inspections of the quality of the fresh and post-bonded electrical devices, e. a device mounting system to mount the ultrasonic transducer and the apparatus onto the mechatronic equipment and to manipulate the ultrasonic transducer and the apparatus for bonding, and f. an ultrasonic signal generation system to supply electrical energy at a predetermined ultrasonic frequency and power for the ultrasonic transducer.

Advantageously, the present invention provides a novel ultrasonically induced pulse heating method and system. The ultrasonic vibration generated from an ultrasonic transducer is rapidly minimised and converted into highly concentrated, localised and controllable thermal energy or heating pulse by an ultrasonic to thermal energy apparatus operatively attached to and covering the operational end of the transducer. The heating pulse softens or plasticises the adhesive to bond the die and the substrate together without physical damage to the die.

The present invention enables the active (circuitry) surface of the die to make contact with the apparatus operatively attached to and covering the operational end of the transducer. The inactive (ground) surface of the die faces away from the apparatus and connects to the substrate through the adhesive.

An ultrasonically induced spontaneous, highly concentrated, localized and controllable pulse heating effect is generated and applied directly to the adhesive underneath the die. The ultrasonic vibration is produced by the transducer. The spontaneous, highly concentrated, localized and controllable heating pulse is converted by the apparatus via a transmission of and damping of the ultrasonic vibration. This converted heating pulse is transferred through the active surface of an individual die to the adhesive underneath the die for every single bonding cycle. This bonding method reduces and possibly removes a high bonding temperature applied continuously from an external heating means or source to a plurality of dies whether already bonded or yet to be bonded.

Manufacturing throughput is increased and the ability to use substrates with less expensive and lower operational temperatures such as synthetic resin bonded papers (SRBP, FR-1 and FR-2) is permitted because the substrate is not subject to a continuous high temperature for a prolonged duration of time.

BRIEF DESCRIPTION OF THE DRAWINGS

An example of the invention will now be described with reference to the accompanying drawings, in which.

DETAILED DESCRIPTION OF THE DRAWINGS

Figure 1:
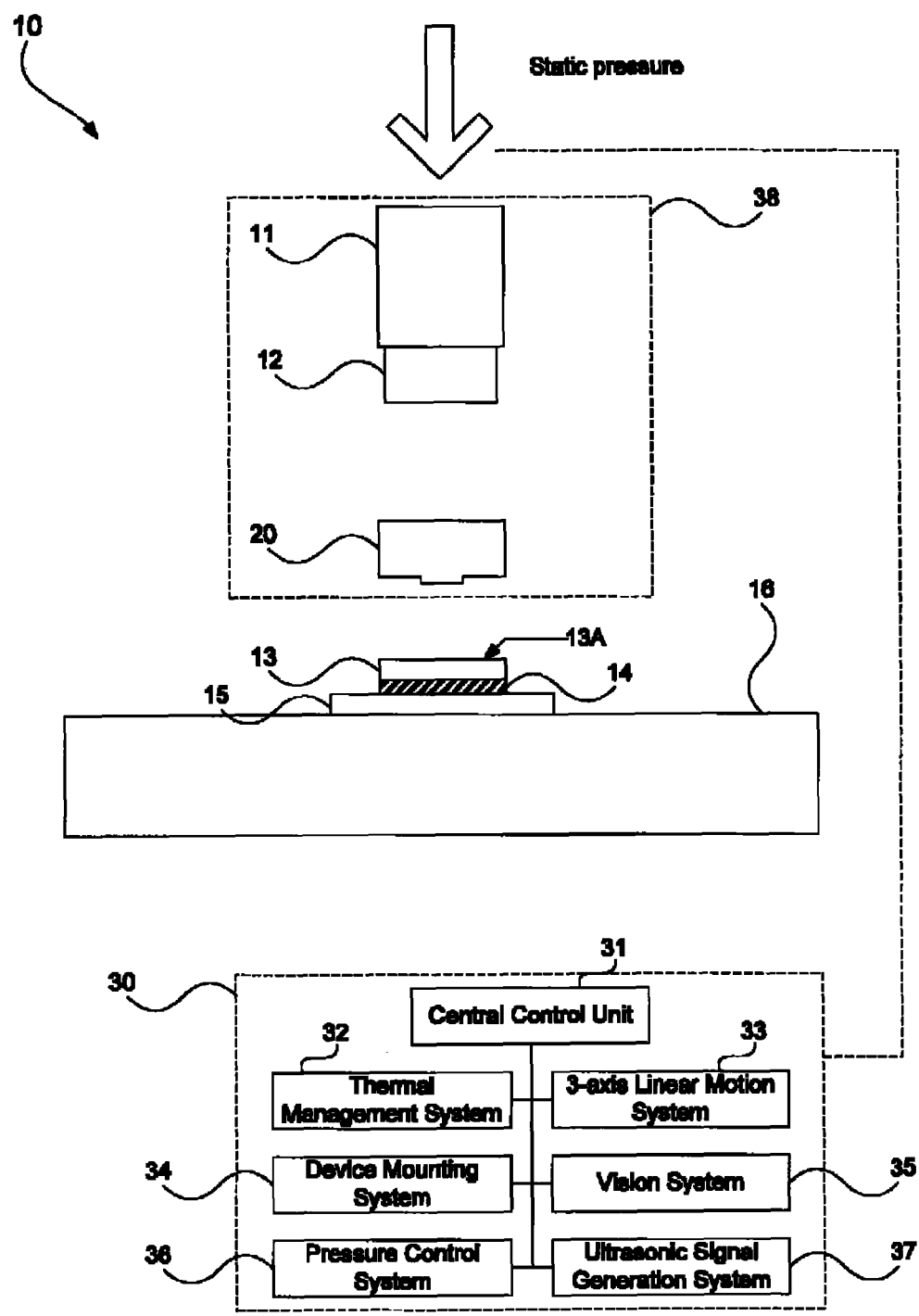
FIG. 1 is a block diagram of a bonding system in accordance with a preferred embodiment to the present invention.

Referring to FIG. 1, a system 10 for bonding electrical devices 13, 15 is provided. For example, the electrical devices are a semiconductor die 13 or chip 13, and a substrate 15. An electrically conductive adhesive 14 is used to adhere the electrical devices 13, 15 together. The system 10 generally includes an ultrasonic transducer 11 and an ultrasonic to thermal energy apparatus 20. The transducer 11 generates an ultrasonic vibration. The apparatus 20 is operatively attached to and covers the operational end 12 of the transducer 11. The apparatus 20 damps the ultrasonic vibration to minimize ultrasonic vibration transmitted to the active (circuitry) surface 13A of the die 13 and causes the conversion of the ultrasonic vibration to thermal energy in the form of a heating pulse which is conducted through the die 13 to the adhesive 14 underneath the die 13. The adhesive 14 is softened or plasticised by the heating pulse to bond the die 13 and the substrate 15 together.

The apparatus 20 is attached to the operational end 12 of the transducer 11 to form a bonding device 38. The ultrasonic vibration generated from the transducer 11 is rapidly damped and converted into a spontaneous, highly concentrated, localized and controllable heating pulse by the apparatus 20. The bonding process involves complicated interactions between the electrical excitation to the transducer 11, the ultrasonic vibration from the transducer 11, the ultrasonic vibration damping by the apparatus 20, the ultrasonic to thermal energy conversion by the apparatus 20, the thermal energy softening or plasticising in the adhesive 14, the static pressure to the bonding device 38 and the planarity between the transducer 11 (or the bonding device 38) and the die 13. The transducer 11 is an electrical to ultrasonic energy converter. The apparatus 20 functions as an ultrasonic to thermal energy converter, a vibration damper and a mechanical protector. The apparatus 20 prevents damage to the delicate die 13 during bonding and at the same time provides enough thermal energy for the adhesive 14 to adhere the die 13 to the substrate 15.

The adhesive 14 may be a dry conductive adhesive film or tape such as Die Attach Film (DAF) or Thermoplastic Adhesive Tape (TAT). For example, a DAF or TAT 14 with a thickness of about 10 μm is laminated onto the backside or inactive (ground) surface of the die 13 prior to the bonding process. The bonding process involves complicated interactions between various process parameters such as the ultrasonic power, bonding pressure, bonding time and worktable temperature (optional).

Figure 14:
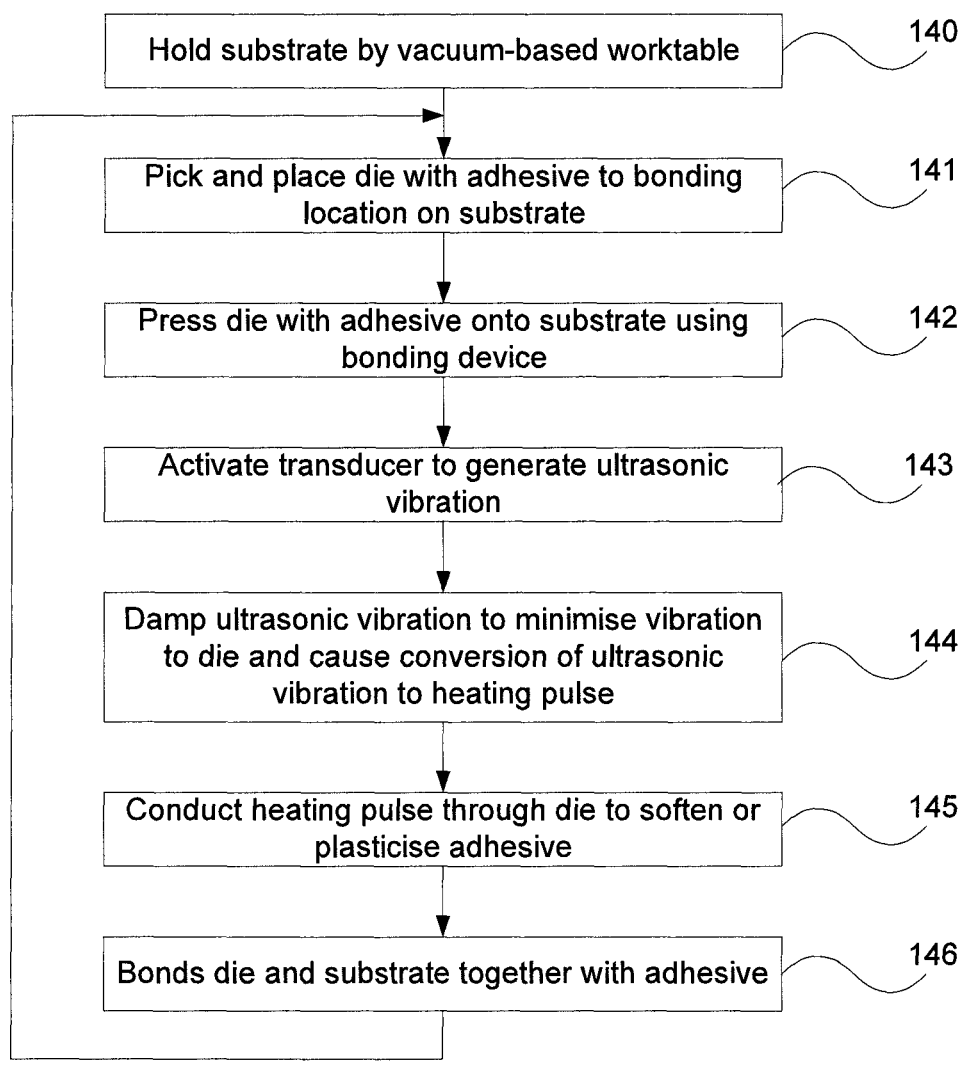
FIG. 14 is a process flow diagram of a method for bonding in accordance with a preferred embodiment to the present invention.

Turning to FIG. 14, in a bonding operation, the substrate 15 is initially held (140) by a vacuum-based worktable 16. In another embodiment, the vacuum-based worktable 16 may be a vacuum-based temperature-controlled worktable 16 to provide an additional heating source for the bonding process. The die 13 with adhesive 14 is picked and placed (141) to the bonding location on the substrate 15. The whole die package 13, 14, 15 is pressed (142) down by the bonding device 38 to make physical contact with all the components in the die package 13, 14, 15. The transducer 11 is activated (143) to generate ultrasonic vibration which is transmitted to the apparatus 20 to damp and convert (144) the ultrasonic vibration into a heating pulse. The adhesive 14 underneath the die 13 is softened or plasticised (145) by the heating pulse and bonds (146) the die 13 to the substrate 15. Both the heating pulse from the apparatus 20 (or the bonding device 38) and any additional heat from the worktable 16 are transferred to the adhesive 14 in the bonding process. The process is repeated for the next die 13 to be bonded to the same or different substrate 15 using an adhesive 14.

The transducer 11 uses a piezoelectric driver to generate ultrasonic vibration at preferably 40 kHz or above. For a bonding operation, the higher the ultrasonic frequency, the shorter the wavelength and the higher the resolution of bonding at the expense of a lower ultrasonic power can be obtained. The piezoelectric driver is generally a Langevin-type prestress transducer which converts electrical energy supplied by an ultrasonic signal generation system into ultrasonic vibration in the form of longitudinal vibration based on the converse piezoelectric effect. The transducer 11 generally comprises a back metallic slab, a plurality of piezoelectric ceramic or composite rings and a front metallic slab/horn clamped and mechanically biased by a central prestress screw. The basic design requirements of the transducer 11 are that the total length of the transducer 11 is minimised to avoid an undesirable tilting effect, a mounting flange is affixed at a vibration node of the transducer 11 for mounting and loading, and the diameter of the operational end 12 of the transducer 11 matches the lateral dimensions of the die 13 to be bonded to the substrate 15 and acquires sufficient amplification of the longitudinal vibration. A half-wavelength transducer 11 is short enough for minimising an undesirable tilting effect during the manipulation of the transducer 11 to make contact with the active surface 13A of the die 13. Multiple half-wavelength transducers 11 allow deep access of die packages 13, 14, 15, especially when the die packages 13, 14, 15 of various sizes (or heights) are located closely to each other.

The transducer 11 may be mounted longitudinally or horizontally. If mounted horizontally, a transverse vibration is applied to the die package 13, 14, 15. However, it is preferable to mount longitudinally to avoid excessive wear of the transducer 11 and damage to the active surface 13A of the die 13. A high co-planarity between the transducer 11 (or the bonding device 38) and the die 13 is provided. The vibration energy is transmitted along the longitudinal axis of the transducer 11 which eliminates the planarity problems and the effect of rubbing which is experienced with transverse vibration.

The material for the apparatus 20 is viscoelastic which has the combined properties of an elastic material and a viscous material. When the viscoelastic material is subject to a cyclical loading such as an ultrasonic vibration, some of the input energy is recovered by a spring-like behavior and some of the input energy is dissipated by a dashpot-like behavior of the material. The ultrasonic vibration dissipated by the viscoelastic material results in a heating effect inside the viscoelastic material of the apparatus 20.

Figure 12:
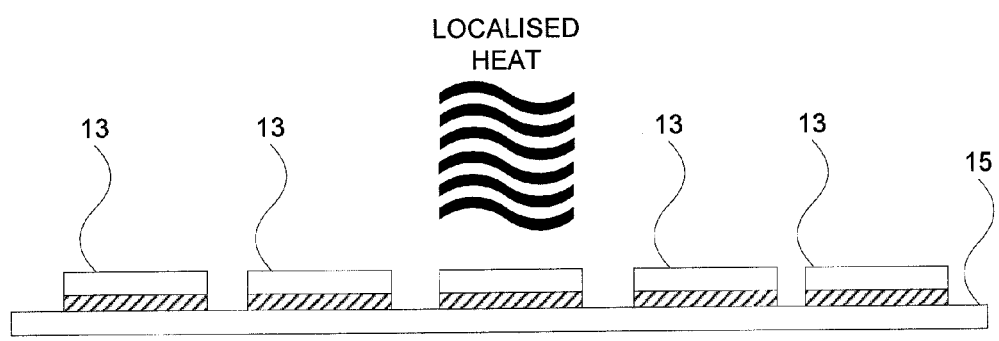
FIG. 12 is a side view of a bonding operation for a die package showing that the thermal pulse is localized to a single die package.

When the transducer 11 is activated, the ultrasonic vibration applied to the apparatus 20 under pressure generates a sinusoidal standing wave at the designated operational frequency such as 40 kHz. The ultrasonic vibration produced under a cyclic sinusoidal strain is dissipated through intermolecular friction in the viscoelastic material, resulting in a rapid heat generation. This causes an ultrasonically induced pulse heating effect which replaces continual heating of the die package 13, 14, 15 in a traditional thermocompression bonding process. Since the ultrasonically induced pulse heating effect is spontaneous, highly concentrated, localized and controllable, a predetermined amount of high temperature heating pulse is only applied directly to the targeted bonding location, for example, to an individual die package 13, 14, 15 as depicted in FIG. 12. The spontaneous, highly concentrated, localized and controllable pulse heating generated at the apparatus 20 ensures that minimal thermal stress is applied on areas beyond the bonding location. This reduces the warpage effect of the low operational temperature substrate 15 and avoids continual heating of the fresh and post-bonded dies 13, adhesives 14 and substrate 15. The thermal stress of the die 13 and the substrate 15 is reduced due to an exact amount of thermal energy applied at a very short duration heating pulse.

The apparatus 20 provides a vibration damping function to reduce the transmission of ultrasonic vibration from the transducer 11 to the die 13 by providing a resilient connection between them. The material for the apparatus 20 effectively reduces the vibration amplitude. The loss factor is the ratio of energy dissipated from a vibrating system to the energy stored in the system for every oscillation. A higher loss factor refers to a higher damping. A loss factor of 0.1 is generally considered a minimum value for significant damping. Therefore, an elastomeric material is suitable for the apparatus 20 to provide an adequate amount of damping during the bonding process. The damping function of the apparatus 20 prevents the transmission of vibration to other parts of the automated bonding equipment via the structural coupling. This ensures that the quality of the equipment will not degrade as quickly from repeated use.

The die 13 is subject to a static pressure applied by the bonding device 38 during bonding. A fast loading time is required in the bonding process to increase the production yield. However, this sudden and fast loading causes a hammering effect which may break the brittle die 13. A small angle usually exists between the bonding device 38 (or the transducer 11) and the worktable 16 due to imperfections in the machining and assembly variations. The non-planarity between the bonding device 38 (or the transducer 11) and the die 13 may concentrate the applied pressure at one edge of the die 13. This concentrated pressure will cause damage to the die 13 or even the substrate 15 in the bonding process. Therefore, a deformable material is suitable for the apparatus 20 to avoid rigid contact and improve the compliance between the bonding device 38 and the die package 13, 14, 15. The distribution of ultrasonic vibration in the apparatus 20 during a bonding operation can also be improved by enhancing the coupling interface using the deformable material.

Therefore, the material for the apparatus 20 needs to be viscoelastic material to convert ultrasonic vibration into heating pulse, an elastomeric material to effectively damp down the ultrasonic vibration from being transmitted to the die 13 and a deformable material to prevent rigid contact and improve the contact between the bonding device 38 and the die 13.

Preferably, the apparatus 20 is made from a silicone rubber compound, for example, GE Silicones MasterMolder RTV600 series. This RTV600 series silicon rubber compound has high service temperatures (−75 to 400° C.), high durometers (62 to 68 Shore A), high tearability (100 to 140 ppi), moderately high tensile strengths (900 to 1100 psi), low shrinkage (linear shrinkage<0.2%) (room temperature cure) and high thermal conductivities (about 0.23 W/m). The silicone rubber compound is a polymeric material that is viscoelastic to a high degree. It has a large loss factor which provides an improved damping efficiency. When the apparatus 20 is attached to the operational end 12 of the transducer 11, it can prevent breakage or even powdering of the die 13 during the bonding process. The silicone rubber compound has a rubber-like elasticity. It has the ability to be deformed to a relatively large degree and then elastically spring back to its original form. This prevents rigid contact and provides compliance between the bonding device 38 and the die 13. Therefore, the bond quality and production yield can both be improved.

The silicone rubber compound of the apparatus 20 is able to withstand a high temperature up to 400° C. which may be generated by the ultrasonically induced pulse heating inside the apparatus 20. During the bonding process, the heating pulse induced in the apparatus 20 is transmitted to the die 13 by thermal conduction. If the material for the apparatus 20 has a higher thermal conductivity, it achieves better heat transfer and therefore improves the bonding performance. The thermal conductivity of silicone rubber compound is about 0.23 W/mΩ·K which provides a better heat transfer to the die 13.

The apparatus 20 operates under a static pressure during the bonding process. Therefore, the ability for the material of the apparatus 20 to recover from compressive deformation is important. Compression set is the ability of a material to return its original thickness after a prolonged compressive stress. The compression set of silicone rubber compound of the apparatus 20 has a consistent value over a wide temperature range and therefore the apparatus 20 is made from a resilient and durable material which is able to operate well in a repeat loading process for bonding.

Chemicals, fluids and oils are contaminants commonly encountered in the semiconductor industry. The silicone rubber compound of the apparatus 20 can prevent contamination of the active surface 13A of the die 13 and the substrate 15 during the bonding process. The material of the apparatus 20 performs well to ozone, UV, heat and other aging factors due to its carbon to carbon backbone nature. It also has a water repelling property so is unaffected by a moist operational environment. It is also a highly inert material and is extremely stable and contains no sulphur and other acid producing chemicals and will not cause staining, corrosion or deterioration of other materials in contact with it. The apparatus 20 may be mass produced using an injection molding method. GE Silicones MasterMolder RTV600 series cures in 24 hours at room temperature.

The specific characteristic of the silicone rubber compound for the apparatus 20 depends upon the additives used and the mixing and vulcanizing conditions. The maximum operational temperature of the apparatus 20 should be kept below 400° C. This can be done by controlling the ultrasonic power inputted to the transducer 11 which mainly controls the amount of heat induced by the apparatus 20.

Figure 2:
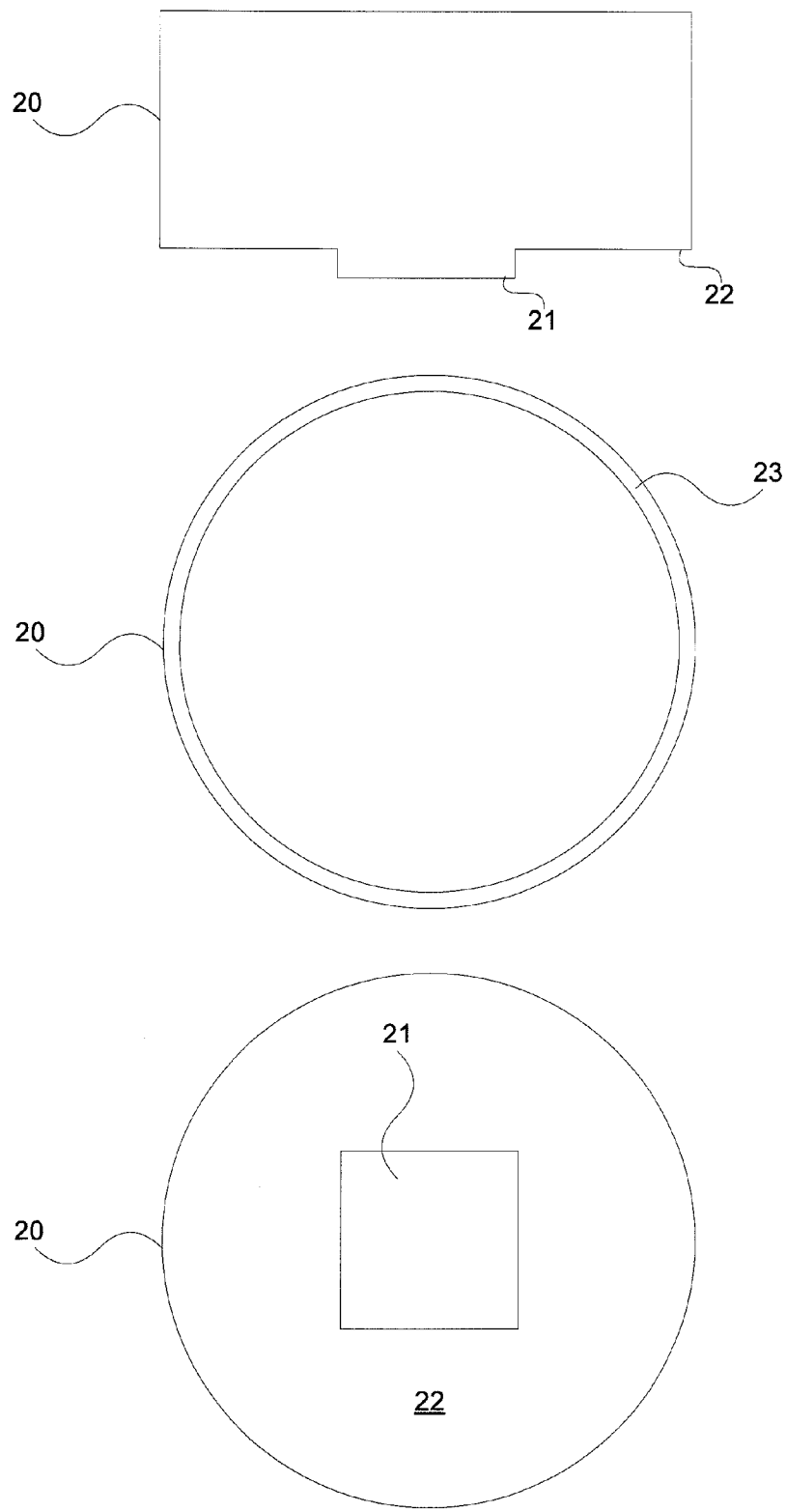
FIG. 2 is a side view, top view and bottom view of an ultrasonic to thermal energy apparatus in accordance with an embodiment of the present invention.
Figure 3:
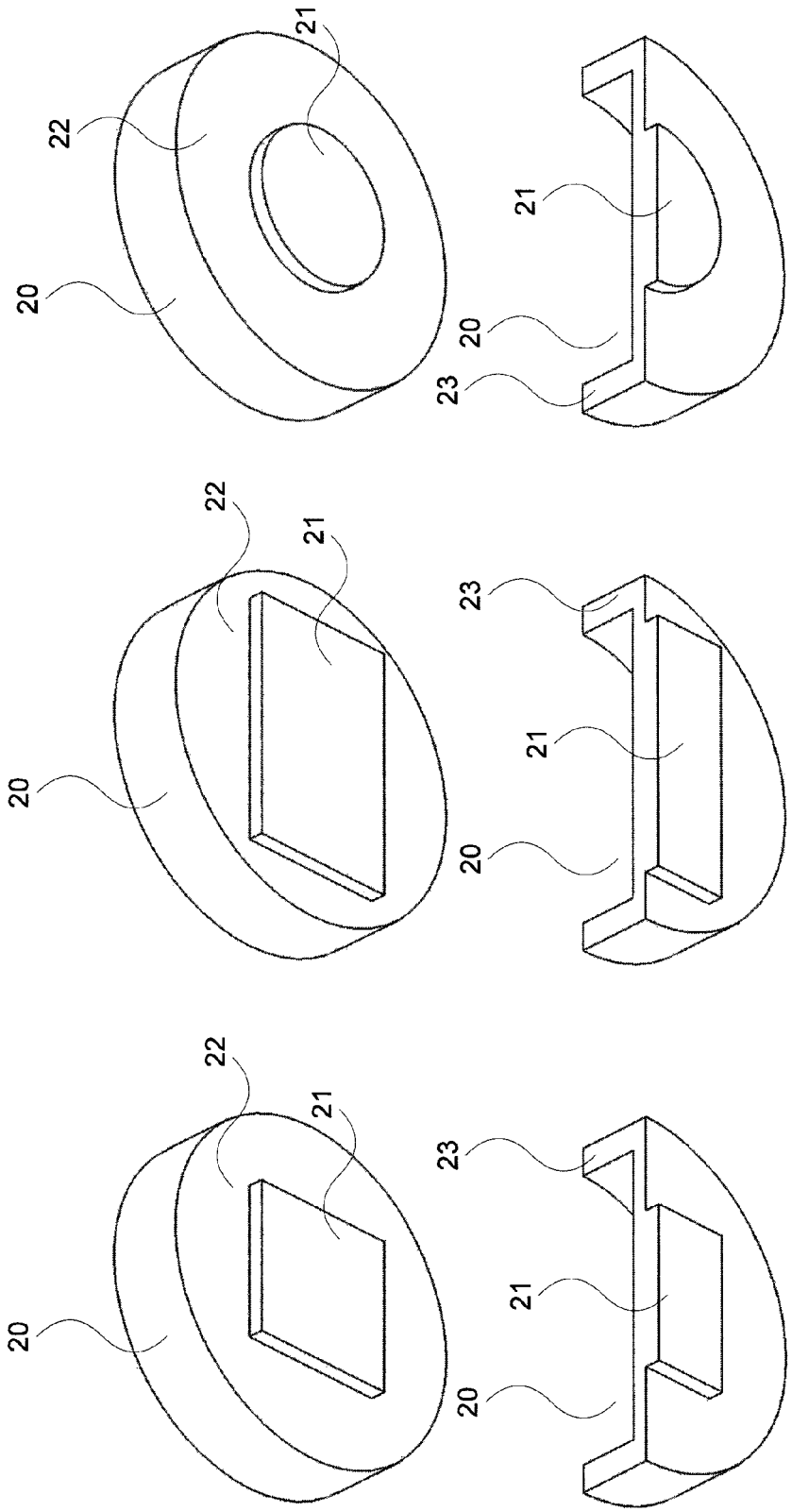
FIG. 3 is a series of perspective views and sectional perspective views of circular shaped ultrasonic to thermal energy apparatuses.
Figure 4:
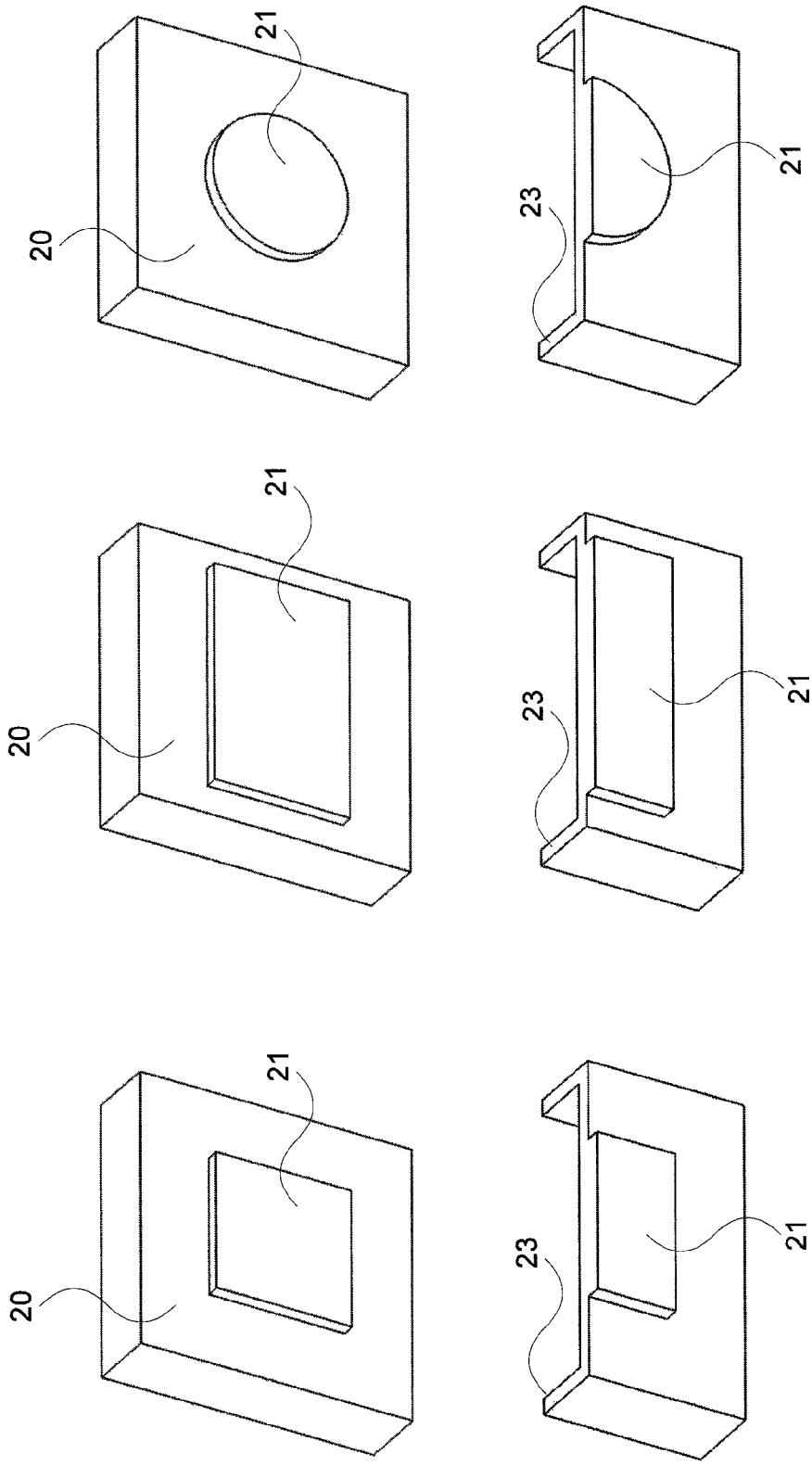
FIG. 4 is a series of perspective views and sectional perspective views of square shaped ultrasonic to thermal energy apparatuses.
Figure 5:
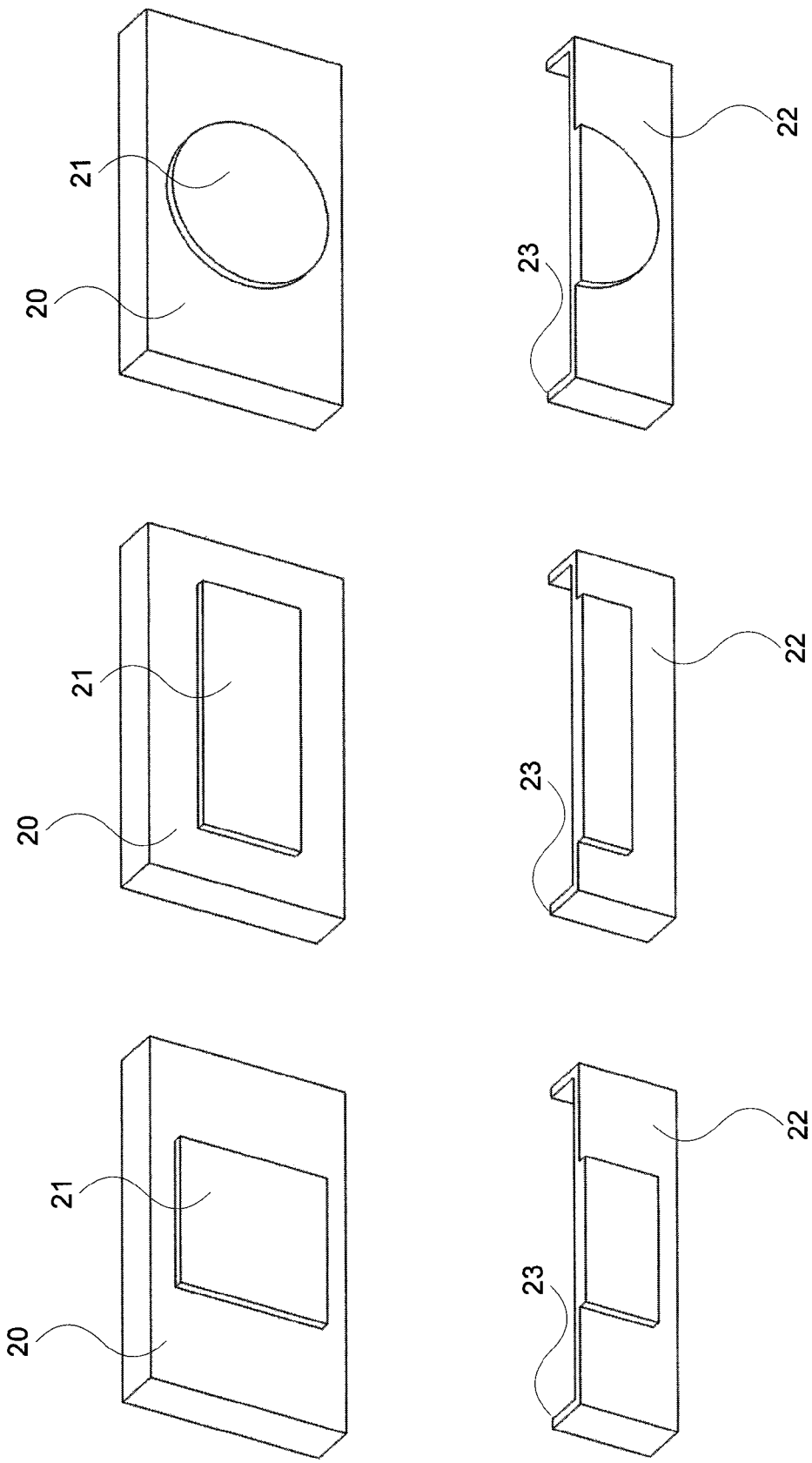
FIG. 5 is a series of perspective views and sectional perspective views of rectangular shaped ultrasonic to thermal energy apparatuses.

The apparatus 20 may wear out after many bonding cycles which means the need to regularly replace the apparatus 20. The apparatus 20 must easily and securely attach and detach from the transducer 11 to maintain high efficiency in a mass manufacturing environment. Depending on the dimensions of the operational end 12 of the transducer 11, an apparatus 20 with a shape of a circular cap is provided as depicted by FIG. 2. In one embodiment, the inner diameter of the circular cap is 18.5 mm which is slightly smaller than the diameter of the operational end 12 of the transducer 11 of 18.8 mm. In this form, there is raised peripheral edge 23. The smaller inner diameter of the circular cap of the apparatus 20 means there is a slight elastic deformation when it is made to cover the operational end 12 of the transducer 11. This ensures the apparatus 20 is firmly attached to the operational end 12 of the transducer 11 without sliding off during the rapid loading and unloading process when bonding electrical devices 13, 15 together.

To provide a high efficiency and rapid ultrasonically induced pulse heating, it is necessary to concentrate the heating pulse at the bonding location (i.e. the die 13) using a thermal energy director 21 or concentrator 21. Otherwise, heat loss to the substrate 15 is substantial when the bottom surface 22 of the apparatus 20 is much larger than the active surface 13A of the die 13. In one embodiment, the energy director is a square shaped protrusion 21 projecting from the bottom surface 22 of the apparatus 20. The protrusion 21 concentrates the induced heating pulse to the die 13 and the adhesive 14 while reducing heat loss to the substrate 15. The concentration of heat by the protrusion 21 increases when the major surface of the protrusion 21 decreases. However, the major surface of the protrusion 21 should not be smaller than the active surface 13A of the die 13 in order to maintain the uniformity of the heat transfer to the adhesive 14. Therefore, a protrusion 21 with a slightly larger major surface having a similar shape to the die 13 should be used. Also, a slightly larger major surface at the protrusion 21 between the apparatus 20 and the die 13 can provide tolerance when aligning the die 13 to the bonding location during positioning.

Generally, the major surface of the protrusion 21 should not be less than 60% of the bottom surface 22 of the apparatus 20. The protrusion 21 may start to tilt or bend when the major surface of the protrusion 21 is less than 60% of the bottom surface 22 of the apparatus 20. Significant tilting or bending occurs when the major surface of the protrusion 21 is less than 50% of the bottom surface 22 of the apparatus 20. The height of the protrusion 21 measured from the bottom surface 22 is preferably 1 mm to provide a sufficiently large clearance between the bottom surface 22 of the apparatus 20, the die 13 and the substrate 15 and to avoid the tilting/bending effect.

The shape and size of the die 13 can vary from type to type. To ensure a good concentration of the pulse heating, an apparatus 20 with a suitable configuration for the protrusion 21 is used for specific dies 13. As the apparatus 20 is removable, an appropriate protrusion 21 can be selected when the shape and size of the die 13 change. Choosing an appropriate protrusion 21 can provide better thermal transfer and thus improve the bonding quality of the die package 13, 14, 15 in a mass manufacturing environment. A larger major surface of the protrusion 21 results in a lower heating pulse amplitude. This is due to the dispersion of the resulting heat over the increased surface area. Hence, an optimal protrusion 21 should be chosen according to the shape and size of the die 13. As a result, the concentration of the heating pulse can be maximised at the bonding location.

Figure 6:
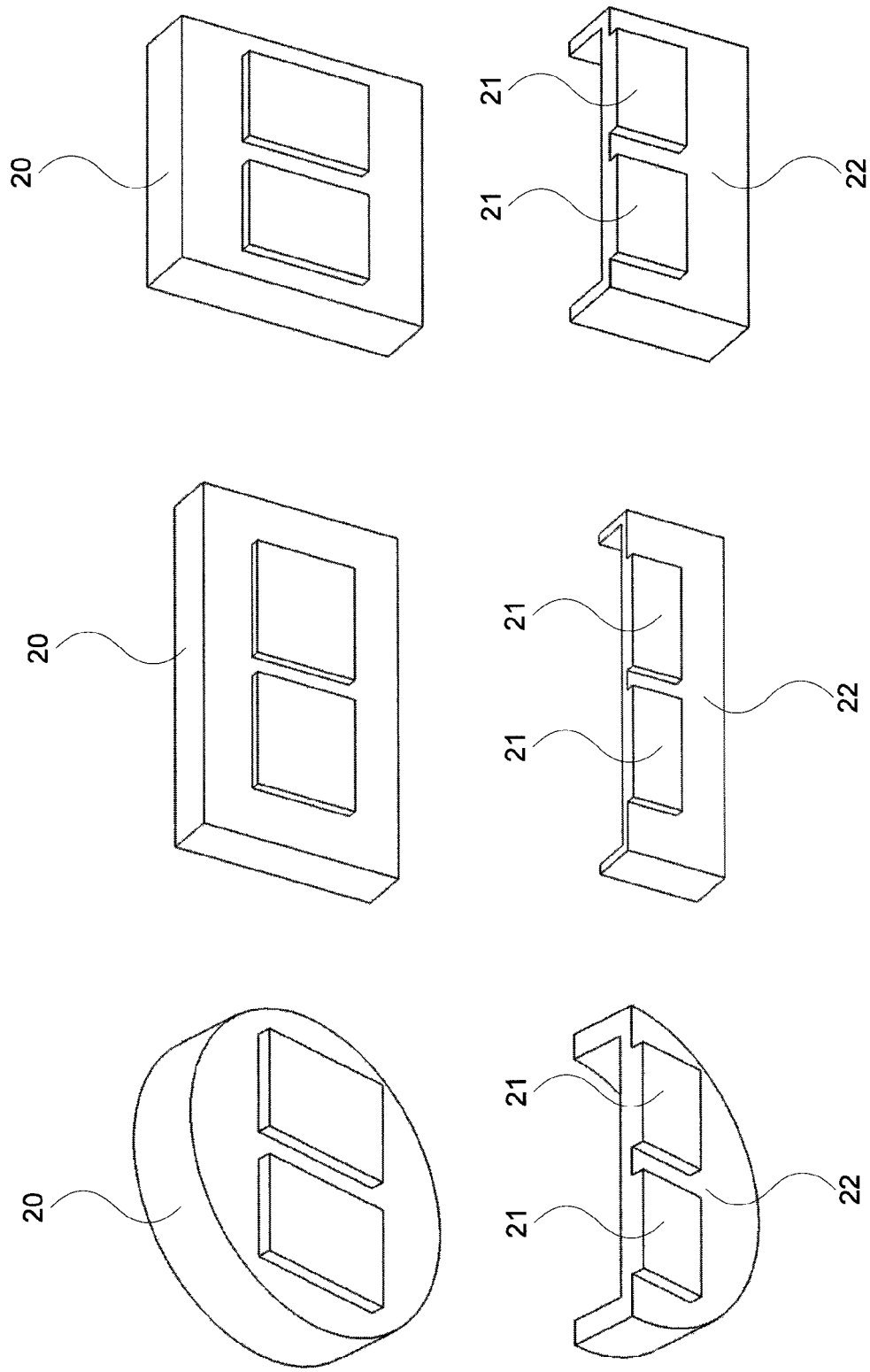
FIG. 6 is a series of perspective views and sectional perspective views of ultrasonic to thermal energy apparatuses with multiple protrusions on their bottom surface.
Figure 7:
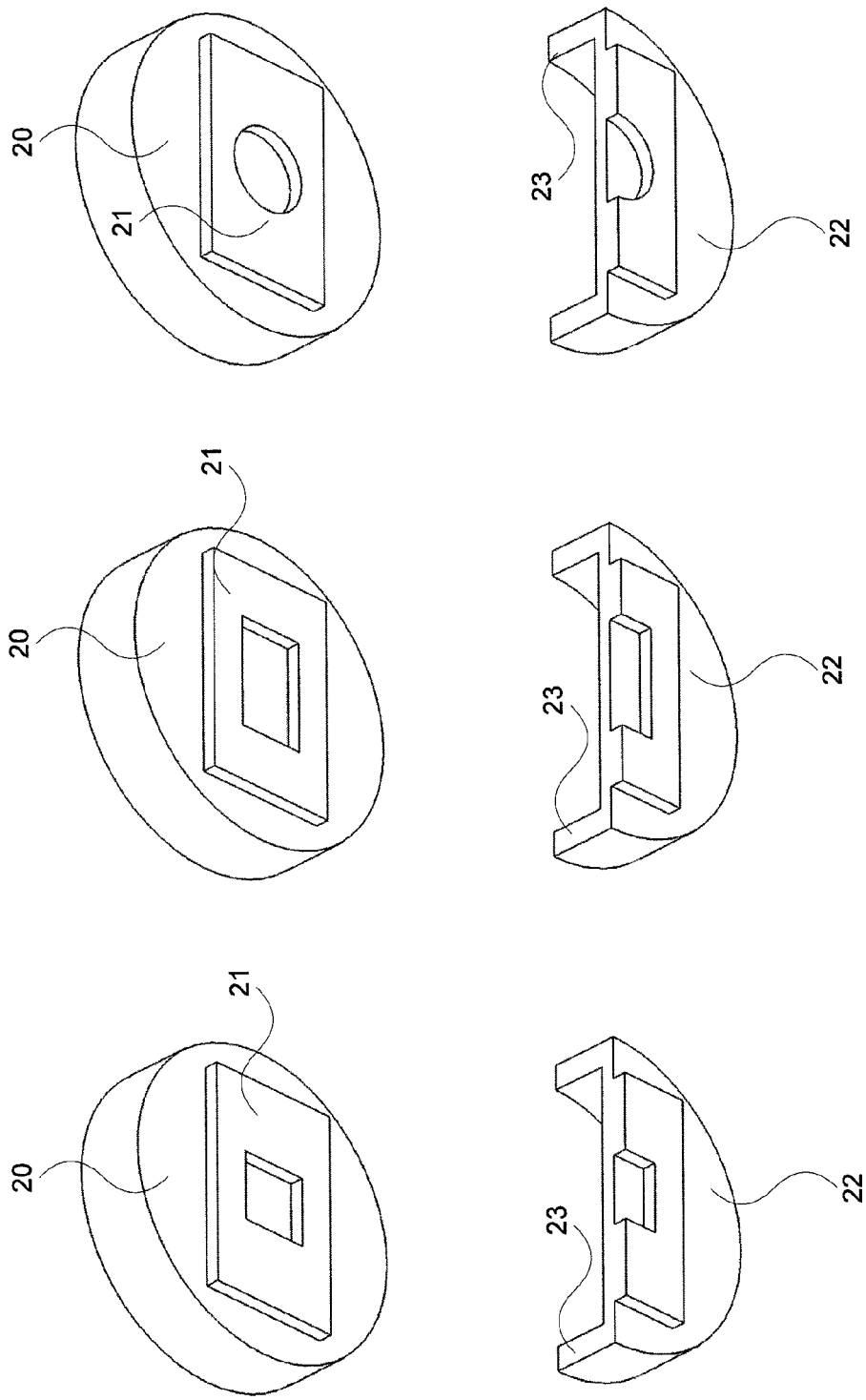
FIG. 7 is a series of perspective views and sectional perspective views of ultrasonic to thermal energy apparatuses with a first type of concave protrusions.
Figure 8:
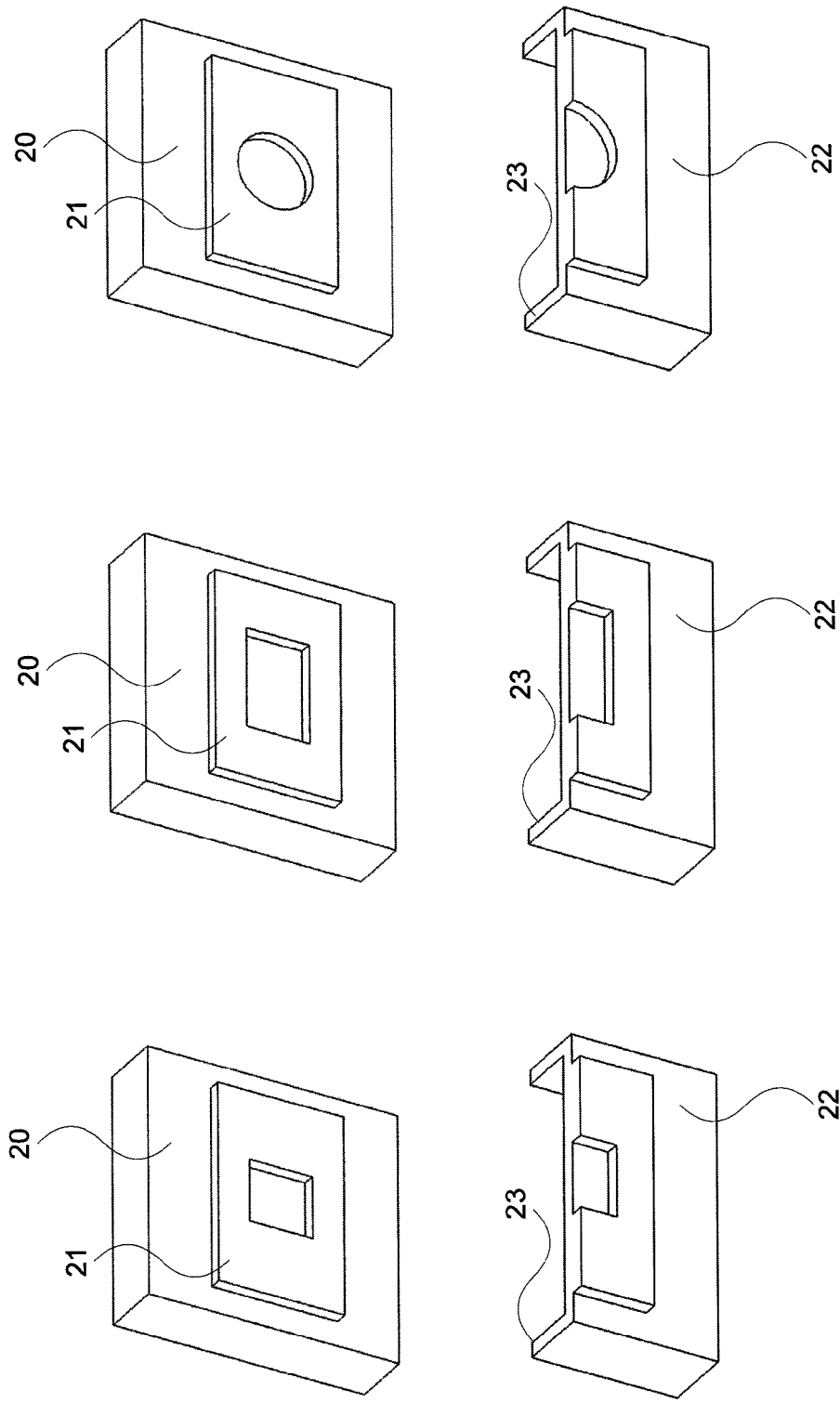
FIG. 8 is a series of perspective views and sectional perspective views of ultrasonic to thermal energy apparatuses with a second type of concave protrusions.
Figure 9:
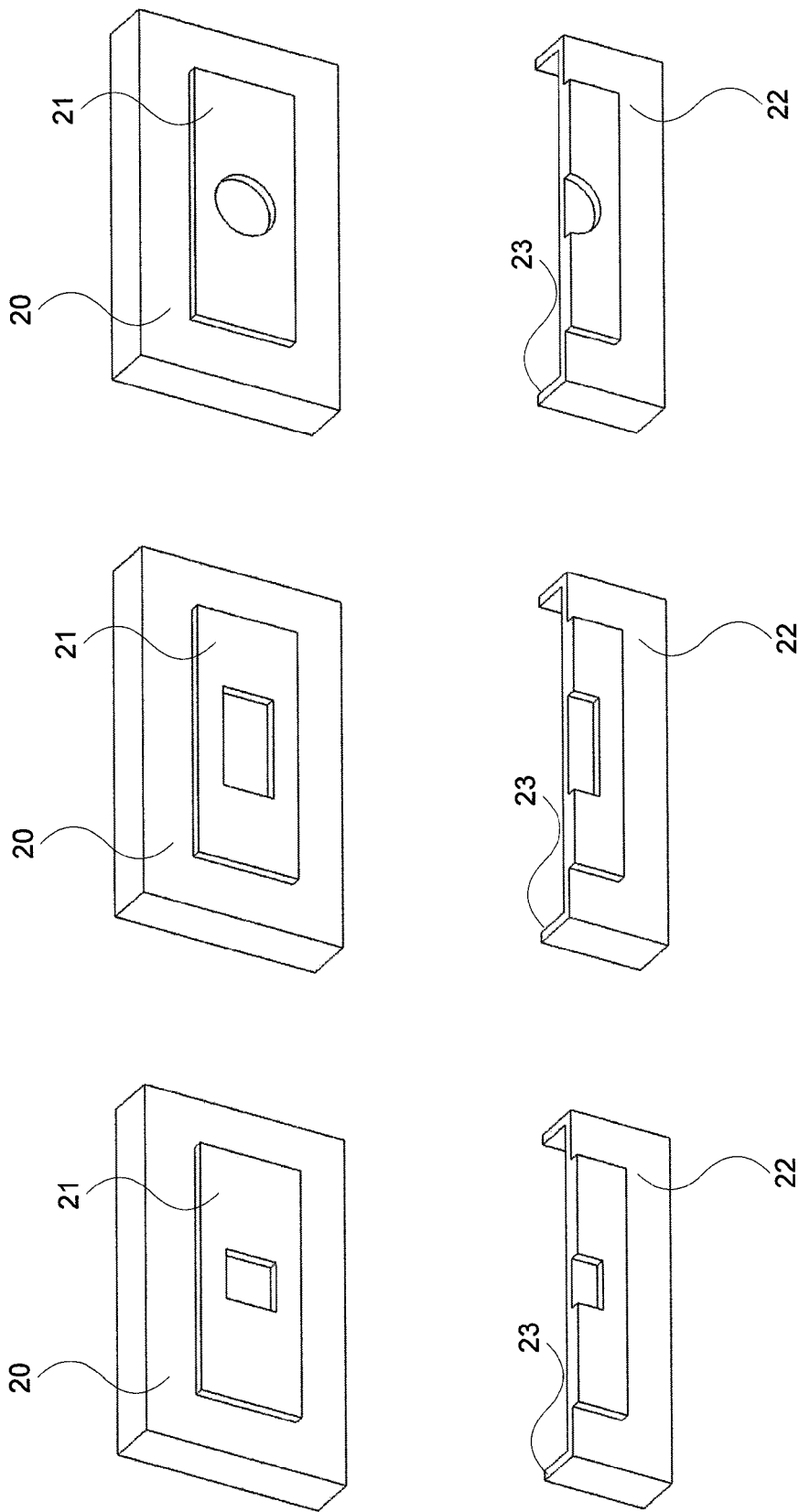
FIG. 9 is a series of perspective views and sectional perspective views of ultrasonic to thermal energy apparatuses with a third type of concave protrusions.

FIGS. 3 to 9 depict various shapes and sizes possible for the apparatus 20 and the protrusion 21. The shape and size of the apparatus 20 are primarily dependent on the operational end 12 of the transducer 11 it is attached to. The shape and size of the protrusion 21 are primarily dependent on the shape and size of the die 13 while preventing tilting/bending of the protrusion 21. FIG. 6 depicts multiple protrusions 21 on the bottom surface 22 of the apparatus 20. The multiple protrusions 21 enable multiple dies to be bonded at the same time. FIGS. 7 to 9 depict concave shaped protrusions 21 on various shaped apparatuses 20. The concave shaped protrusions 21 are especially useful for holding the dies 13 when a horizontal or transverse operation of the transducer 11 is desired.

Figure 11:
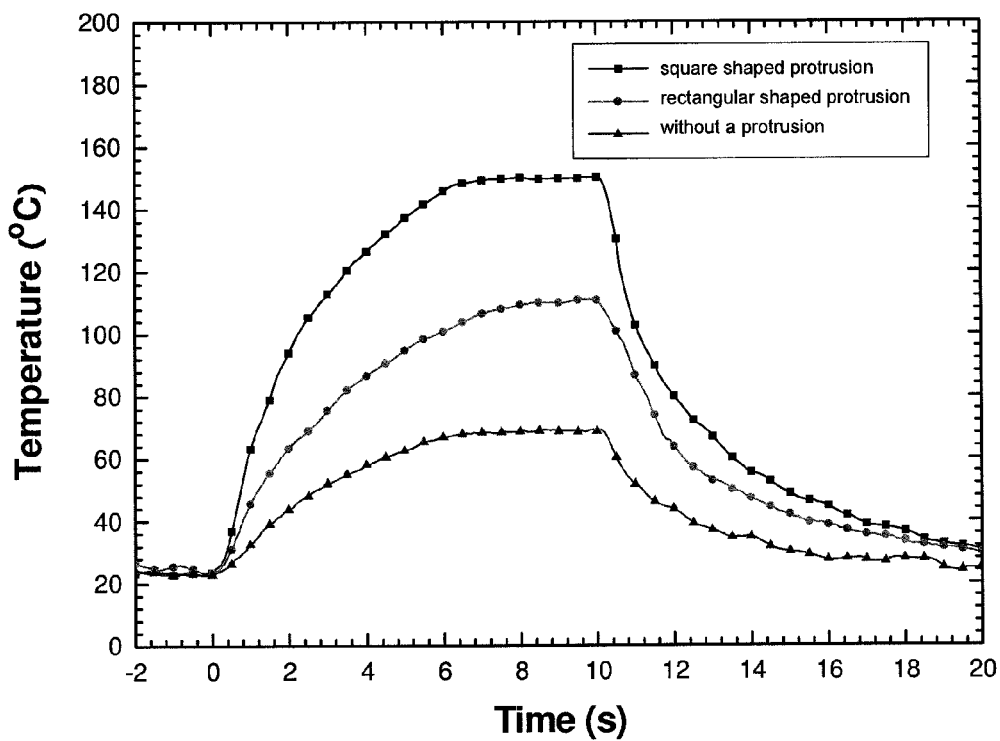
FIG. 11 is a chart depicting the temperature profile of the adhesive with a square shaped protrusion for the ultrasonic to thermal energy apparatus compared to a rectangular shaped protrusion for the apparatus compared to an apparatus without a protrusion.

FIG. 11 compares the temperature profile of the adhesive 14 when a protrusion 21 for the apparatus 20 is used, for example, an apparatus 20 with a square or rectangular shaped protrusion 21 against an apparatus 20 without a protrusion 21. An apparatus 20 without a protrusion 21 has a slower temperature rise and a reduced maximum temperature compared to an apparatus 20 with a protrusion 21 when ultrasonic vibration is applied.

Figure 10:
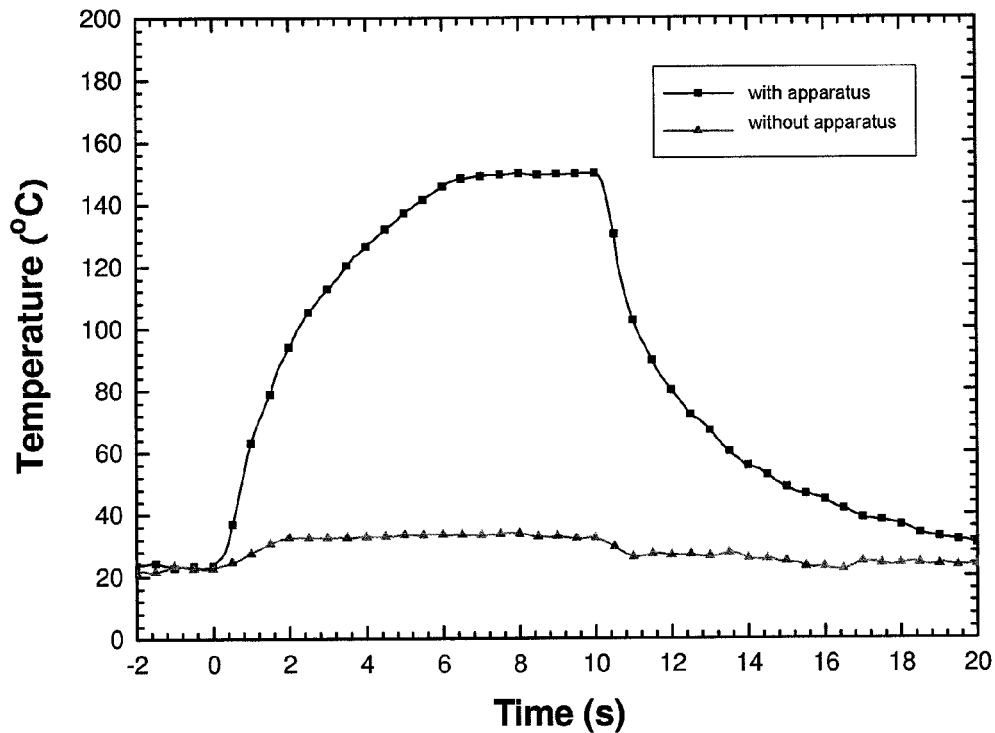
FIG. 10 is a chart depicting the temperature profile of the adhesive with an ultrasonic to thermal energy apparatus compared to the temperature profile of the adhesive without an apparatus.

The apparatus 20 can provide an effective pulse heating for softening the adhesive 14 by its energy converting ability. It also prevents the die 13 from damage by its vibration damping and mechanical protecting functions. There is a sharp increase in temperature when activating the transducer 11 with the apparatus 20 attached. The temperature rapidly rises from room temperature at 23.5° C. to around 150° C. and becomes saturated within 6 seconds. Referring to FIG. 10, there is only a slight increase in temperature from room temperature to around 30° C. when no apparatus 20 is attached to the transducer 11. The small amount of heat induced without an apparatus 20 is because of the viscoelastic nature of the adhesive 14 itself which converts the vibration energy to 6.5° C. of heat as a by-product.

The apparatus 20 protects the die 13 from ultrasonic vibration and rigid contact with the operational end 12 of the transducer 11. Without the apparatus 20, the die 13 will be totally destroyed by the ultrasonic vibration from the transducer 11. However, when the apparatus 20 is used, the die 13 is in a good condition and without any defects detected by microscopic inspection. Therefore, the apparatus 20 is critical in protecting the die 13 from damage in the bonding process. A heating pulse is generated by the apparatus 20 when the transducer 11 is activated for a short predetermined amount of time. The heating pulse is at its highest level at the major surface of the protrusion 21 of the apparatus 20 with the die 13. A rapidly induced heating pulse (for example, up to 150° C. in FIGS. 10 and 11) is achievable using the apparatus 20 for adhesive adhesion. At the adhesive 14 level, ultrasonic vibration instead of ultrasonically induced heating pulse occurs when no apparatus 20 is used which leads to the breakage or even powdering of the die 13.

Figure 13:
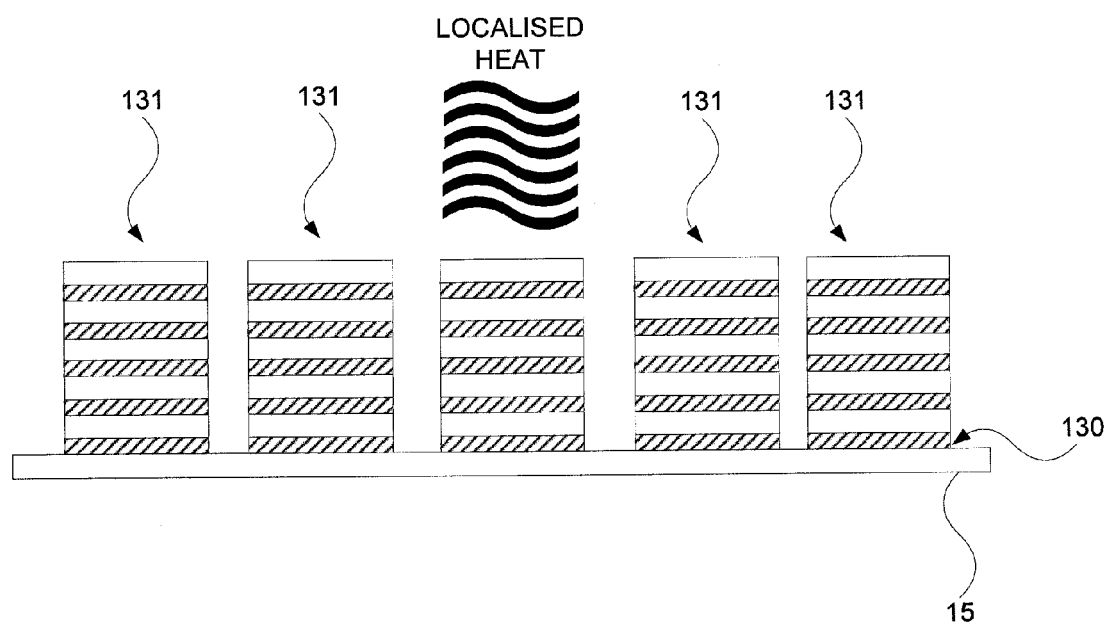
FIG. 13 is a side view of a bonding operation for a stacked die package showing that the thermal pulse is localized to a single stacked die package.

Finite Element Analysis (FEA) on heat transfer for a stacked die package 131 as shown in FIG. 13 is performed using process parameters: an ultrasonic power of 50 W, a bonding force of 60 N and a bonding time of 3 seconds at room temperature. FEA results provide a preliminary prediction of the success of the bonding process for a stacked die package 131. The number of die-adhesive pairs 13, 14 that are possible for the stacked die package 131 is determined by the amount of heat which can reach the adhesive-substrate interface 130.

The temperature at the adhesive-substrate interface 130 decreases when the number of stacked die-adhesive pairs 13, 14 increases. The temperature at the outer edge of the adhesive-substrate interface 130 corresponds to the position with the lowest temperature at the adhesive-substrate interface 130. The maximum temperature decreases from 118° C. in a stacked die package 131 with two die-adhesive pairs 13, 14 to 102° C. in a stacked die package 131 with six die-adhesive pairs 13, 14. Based on the FEA prediction, the temperature at the adhesive-substrate interface 130 will drop below 100° C. with further increases in size of the stacked die package 131 beyond six die-adhesive pairs 13, 14. Therefore, the number of die-adhesive pairs 13, 14 that can be stacked under this bonding condition is less than six.

Stacked die packages 131 have rapidly developed in recent years due to limited available physical space and the need for multi-functionality within small electronics products. Typically, a die 13 having a thickness less than 75 μm is used in a stacked die configuration 131. In the traditional thermocompression stacked die bonding process, the die-adhesive pairs 13, 14 are bonded one by one over the underside die-adhesive pair(s) 13, 14. The post-bonded die-adhesive pairs 13, 14 are subject to high temperature heating over a long duration until all the die-adhesive pairs 13, 14 in the stack have been bonded. Consequently, the adhesive 14 of the base die 13 may liquidize and contaminate the substrate 15 due to epoxy spread out. In contrast, using the ultrasonically induced pulse heating provided by the apparatus 20 reduces the high temperature continual heating. Stacked die bonding on the substrate 15 is performed with all the die-adhesive pairs 13, 14 in the stacked die package 131 being bonded in a single processing cycle. When the heating pulse is generated and applied from the direction of the die 13 towards the substrate 15, a temperature gradient in the stacked die package 131 exists. The heating pulse is transferred from the high temperature region (active surface 13A of the die 13) to the low temperature region (underside of the substrate 15) by molecular activities.

Turning back to FIG. 1, the bonding device 38 is integrated with equipment 30. The equipment 30 is an automated mechatronic unit formed by a thermal management system 32, a three-axis linear motion system 33, a device mounting system 34, a vision system 35, a pressure control system 36 and an ultrasonic signal generation system 37. These systems 32, 33, 34, 35, 36, 37 are controlled by a central control unit 31 for communication between the systems 32, 33, 34, 35, 36, 37.

The relative position and direction during the bonding process is precisely controlled such that the die package 13, 14, 15 and the bonding device 38 are accurately moved to a predetermined position for bonding. The three-axis linear motion system 33 provides precise movement in the x, y, and z directions in the equipment 30. In the equipment 30, there are two motors engaged in the x-y worktable 16. One motor rotates to move the worktable 16 in the x direction, while the other moves the worktable 16 in the y direction. These two motors can move the die package 13, 14, 15 on the worktable 16 to a position where the bonding will occur. The die package 13, 14, 15 may be held by vacuum in the worktable 16 to prevent influence from the high speed motion. Also, there is a third motor in the z-axis to provide up and down movement for the bonding device 38. This motor can move the bonding device 38 to the surface of the die 13 before it is pressed by the pressure control system 36. During a bonding operation, the central control unit 31 transmits control signals to the motor drivers which control the motors to drive the worktable 16 and the bonding device 38 at the programmed velocity and acceleration. Encoders provide a closed-loop system and are used as the feedback devices so that the accuracy, precision and repeatability of the bonding process are maintained. The advantage of using such a system 33 is its quick response to changes in velocity and acceleration which is required for the high throughput bonding process.

The thermal management system 32 controls the temperature of the worktable 16. This system 32 provides a closed loop temperature control so that the worktable 16 can maintain at a steady temperature level. A digital temperature controller is installed to control the heater block which consists of a heater and a temperature sensor. In the bonding process, the digital temperature controller transmits a signal to control the power to the heater. The temperature of the heater block is measured by the temperature sensor and a feedback signal is returned to the temperature controller. The power applied to the heater is adjusted according to the feedback signal so that the worktable 16 is maintained at a predetermined temperature for the bonding process. To prevent the thermal energy being transmitted to the entire part of the equipment 30 through conduction, a thermal isolation device is inserted between the worktable 16 and the motor couplers of the three-axis linear motion system 33.

The pressure control system 36 provides a static pressure to the die package 13, 14, 15 during bonding. This system 36 includes a pneumatic regulator, a solenoid valve, an air cylinder, a pressure sensor and a controller. The pneumatic regulator controls the pressure inside the air cylinder while the solenoid valve controls the up and down movement of the piston insides the air cylinder. Accurate pressure measurement is important. The pressure sensor measures the bonding pressure applied. A feedback signal from the pressure sensor is transmitted to the central control unit 31 via the controller of the system 36 for adjusting the amount of pressure applied to the die package 13, 14, 15. During the application of pressure, the motion along the z-axis is locked to prevent sliding of the bonding device 38 due to the loading action.

The vision system 35 assists the three-axis linear motion system 33 to automatically position the die package 13, 14, 15 to the bonding location. This system 35 includes a vision controller and a camera. During the bonding process, an image of the worktable 16 is captured by the camera. The die package 13, 14, 15 is recognized by the camera and aligned to a sensing area by the vision controller. The die package 13, 14, 15 is accurately moved to the bonding location by the three-axis linear motion system 33 for the subsequent bonding process. The vision system 35 also provides a preproduction inspection function to avoid defective dies 13 from being used. This in-situ preproduction inspection function is useful, especially for stacking multiple die-adhesive pairs 13, 14 to form stacked die packages 131. The system 35 also provides a postproduction inspection function for the as-bonded die packages 13, 14, 15.

The device mounting system 34 is used to mount a flange which is positioned at a vibration nodal position of the transducer 11 to minimize any loss of ultrasonic vibration energy. Co-planarity between the transducer 11 (or the bonding device 38) and the worktable 16 is very important to ensure the static pressure is uniformly applied to the die package 13, 14, 15. A uniform pressure being applied can prevent delamination and improve the bondability of the die package 13, 14, 15 to the substrate 15. Therefore, the device mounting system 34 is adjustable at the yaw, pitch and roll orientation. By adjusting the orientation, the co-planarity can be altered to an acceptable level.

The ultrasonic signal generation system 37 is used to generate an electrical energy at the desired ultrasonic frequency and power to the transducer 11. This high frequency electrical energy is transmitted to the transducer 11 to generate ultrasonic vibration for the bonding process. The system 37 is preferably in constant-voltage and digital phase-locked-loop (PLL) bases which ensure the transducer 11 is operating at its resonance frequency. It should provide a selector switch to adjust the amount of power applied to the transducer 11. The system 37 also contains overload protection circuitry to prevent damage of the transducer 11 caused by excessive power being applied.

It will be appreciated by persons skilled in the art that numerous variations and/or modifications may be made to the invention as shown in the specific embodiments without departing from the scope or spirit of the invention as broadly described. The present embodiments are, therefore, to be considered in all respects illustrative and not restrictive.

I claim:

1. A system for bonding electrical devices using an electrically conductive adhesive to adhere the electrical devices together, the system comprising:
   an ultrasonic transducer configured to generate an ultrasonic vibration; and
   an ultrasonic to thermal energy apparatus operatively attached to and covering an operational end of the ultrasonic transducer, the apparatus damping the ultrasonic vibration to minimize ultrasonic vibration transmitted to a first electrical device and causing a conversion of the ultrasonic vibration to a heating pulse which is conducted through the first electrical device to the adhesive, wherein the adhesive is softened by the heating pulse to bond the electrical devices together.

2. The system according to claim 1, further comprising a die adapter attached to the ultrasonic transducer and disposed between the apparatus and the ultrasonic transducer, the die adapter providing a shape and size adaption for the ultrasonic transducer to accommodate a first electrical device of any shape and size.

3. The system according to claim 1, further comprising mechatronic equipment controlled by a central control unit, the mechatronic equipment comprising:
- a three-axis linear motion system to provide precise movement of the worktable in the x and y directions and of the ultrasonic transducer and the apparatus in the z direction in the mechatronic equipment;
- a thermal management system to control a temperature of the worktable;
- a pressure control system to apply a static pressure to the ultrasonic transducer and the apparatus to press the adhesive underneath the first electrical device against a second electrical device;
- a vision system to instruct the three-axis linear motion system where to move the first electrical device based on an image captured of the first electrical device and the worktable and to perform in-situ preproduction and postproduction inspections of the quality of the fresh and post-bonded electrical devices;
- a device mounting system to mount the ultrasonic transducer and the apparatus onto the mechatronic equipment and to manipulate the ultrasonic transducer and the apparatus for bonding; and
- an ultrasonic signal generation system to supply electrical energy at a predetermined ultrasonic frequency and power for the ultrasonic transducer.

4. The system according to claim 1, wherein the ultrasonic to thermal energy apparatus comprises:
- a bottom surface to cover the operational end of an ultrasonic transducer and contact an active surface of the first electrical device; and
- a raised peripheral edge extending from the bottom surface for resiliently attaching the apparatus to the operational end of the ultrasonic transducer,
- wherein the apparatus is made from a material that is viscoelastic and deformable and dampens ultrasonic vibration generated by the ultrasonic transducer and causes the conversion of the ultrasonic vibration to the heating pulse.

5. The system according to claim 4, further comprising a protrusion outwardly projecting from the bottom surface of the apparatus to concentrate the heating pulse.

6. The system according to claim 4, wherein the major surface area of the protrusion is larger than or equal to the active surface area of the first electrical device.

7. The system according to claim 4, wherein the major surface area of the protrusion is larger than or equal to 60% of the bottom surface of the apparatus.

8. The system according to claim 4, wherein the height of the protrusion from the bottom surface is 1 mm.

9. The system according to claim 4, further comprising a plurality of protrusions to enable a plurality of dies to be bonded to at least one substrate at the same time.

10. The system according to claim 4, wherein the protrusion has a concave shape for holding a die when a horizontal or transverse operation of the transducer is used.

11. The system according to claim 4, wherein the material is a silicone rubber compound.

\* \* \* \* \*

UNITED STATES PATENT AND TRADEMARK OFFICE
CERTIFICATE OF CORRECTION

| | | |
|---|---|---|
| PATENT NO. | : 8,833,418 B2 | Page 1 of 1 |
| APPLICATION NO. | : 13/340168 | |
| DATED | : September 16, 2014 | |
| INVENTOR(S) | : Or et al. | |

It is certified that error appears in the above-identified patent and that said Letters Patent is hereby corrected as shown below:

On the Title Page

Item (75) Inventor: Derek Siu Wing Or, Hong Kong, HK

It should show:

(75) Inventors: Derek Siu Wing Or, Hong Kong, HK
                    Yiu Ming Cheung, Hong Kong, HK Signed and Sealed this
Fourteenth Day of July, 2015

Michelle K. Lee
*Director of the United States Patent and Trademark Office*